United States Patent

Haas et al.

(10) Patent No.: US 7,700,905 B2
(45) Date of Patent: Apr. 20, 2010

(54) RADIATION DETECTOR WITH CONTROLLED SPECTRAL SENSITIVITY DISTRIBUTION

(75) Inventors: Heinz Haas, Regensburg (DE); Frank Möllmer, Matting b. Pentling (DE); Michael Schwind, Sinzing (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 308 days.

(21) Appl. No.: 10/573,095

(22) PCT Filed: Aug. 24, 2004

(86) PCT No.: PCT/DE2004/001877

§ 371 (c)(1),
(2), (4) Date: Oct. 2, 2006

(87) PCT Pub. No.: WO2005/041247

PCT Pub. Date: May 6, 2005

(65) Prior Publication Data

US 2007/0040101 A1     Feb. 22, 2007

(30) Foreign Application Priority Data

Sep. 30, 2003   (DE) ............................... 103 45 410

(51) Int. Cl.
*G01J 3/50*     (2006.01)
(52) U.S. Cl. ..................... 250/226; 257/189
(58) Field of Classification Search .......... 250/226; 257/189

See application file for complete search history.

(56) References Cited

U.S. PATENT DOCUMENTS 3,508,126 A     4/1970   Newman et al.

(Continued)

FOREIGN PATENT DOCUMENTS

DE           626680           2/1936

(Continued)

OTHER PUBLICATIONS

Karrer, U. et al., "AlGaN-based Ultraviolet Light Detectors with Integrated Optical Filters", *Journal of Vacuum Science & Technology B*, vol. 18, No. 2, pp. 757-760, 2000.

(Continued)

*Primary Examiner*—Georgia Y Epps
*Assistant Examiner*—Kevin Wyatt
(74) *Attorney, Agent, or Firm*—Fish & Richardson P.C.

(57) ABSTRACT

The invention concerns a radiation detector for detecting radiation having a defined spectral sensitivity distribution (14) that exhibits a sensitivity maximum at a defined wavelength $\lambda_0$, wherein the radiation detector preferably contains a III-V semiconductor material and particularly preferably comprises at least one semiconductor chip (1) and at least one optical filter disposed after the semiconductor chip, the semiconductor chip containing at least one III-V semiconductor material and the optical filter absorbing radiation of a wavelength that is greater than the wavelength $\lambda_0$ of the sensitivity maximum.

25 Claims, 2 Drawing Sheets

U.S. PATENT DOCUMENTS

| | | |
|---|---|---|
| 3,903,413 A | 9/1975 | Manning |
| 4,360,246 A | 11/1982 | Figueroa et al. |
| 4,451,691 A | 5/1984 | Fraas |
| 4,713,493 A | 12/1987 | Ovshinsky |
| 4,820,915 A | 4/1989 | Hamakawa et al. |
| 5,039,490 A * | 8/1991 | Marsoner et al. ......... 422/82.01 |
| 5,373,182 A * | 12/1994 | Norton ....................... 257/440 |
| 5,406,067 A | 4/1995 | Keller |
| 5,448,082 A * | 9/1995 | Kim ............................ 257/82 |
| 5,449,923 A | 9/1995 | Kuo et al. |
| 5,583,351 A | 12/1996 | Brown et al. |
| 5,600,157 A | 2/1997 | Abiko et al. |
| 5,703,689 A * | 12/1997 | Powell ....................... 356/432 |
| 5,813,753 A * | 9/1998 | Vriens et al. ................ 362/293 |
| 6,038,023 A * | 3/2000 | Carlson et al. .............. 356/326 |
| 6,476,374 B1 | 11/2002 | Kozlowski et al. |
| 2002/0074553 A1* | 6/2002 | Starikov et al. ............... 257/77 |
| 2003/0001167 A1 | 1/2003 | Eriksson et al. |
| 2003/0122060 A1* | 7/2003 | Nixon et al. ............ 250/214 C |
| 2003/0222264 A1 | 12/2003 | Matsuo et al. |
| 2005/0072908 A1* | 4/2005 | Grunert et al. .............. 250/226 |
| 2007/0040101 A1 | 2/2007 | Haas et al. |
| 2008/0237633 A1 | 10/2008 | Jaeger et al. |

FOREIGN PATENT DOCUMENTS

| | | |
|---|---|---|
| DE | 2315054 | 10/1974 |
| DE | 2457572 | 6/1975 |
| DE | 19621965 | 12/1997 |
| DE | 10154277 | 1/2003 |
| EP | 0 509215 | 10/1992 |
| GB | 2 107112 | 4/1983 |
| JP | 2000-252482 | 9/2000 |
| JP | 2001308351 | 11/2001 |
| JP | 2003150089 | 5/2003 |
| JP | 2003-258292 | 9/2003 |
| TW | 473893 | 1/2002 |
| WO | WO 98/22982 | 5/1998 |
| WO | WO 2005/041247 | 5/2005 |
| WO | WO 2005/096394 | 10/2005 |

OTHER PUBLICATIONS

Authorized officer: Roy, C., *International Search Report*, PCT/DE2004/001877, 2005.

* cited by examiner

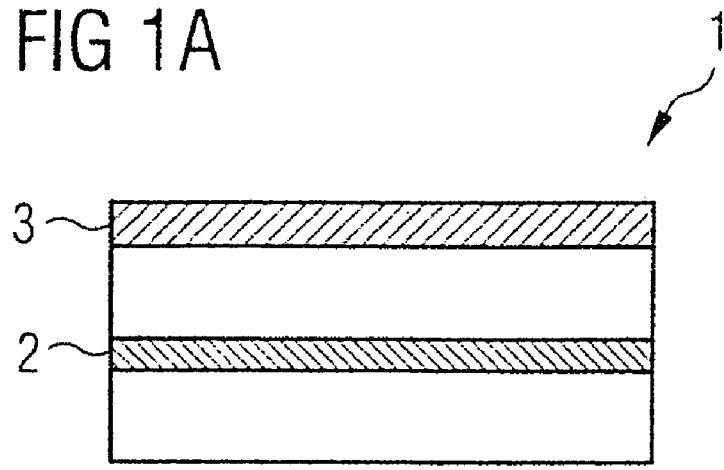
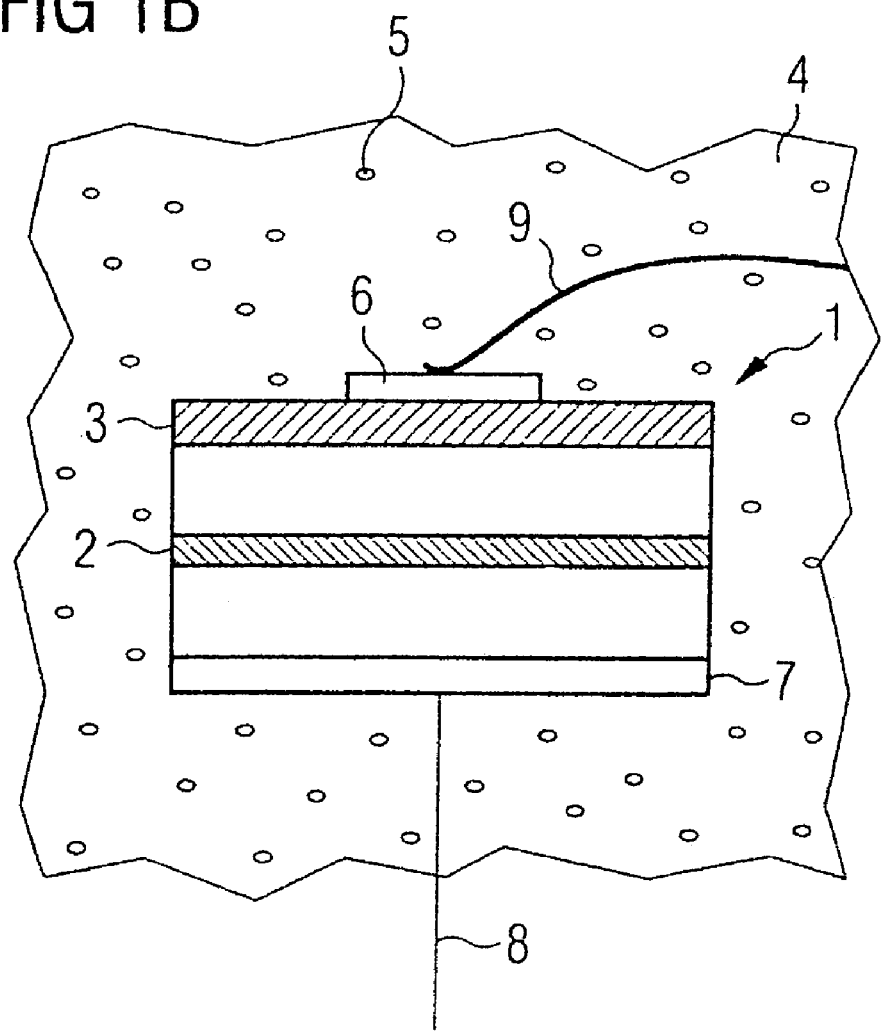

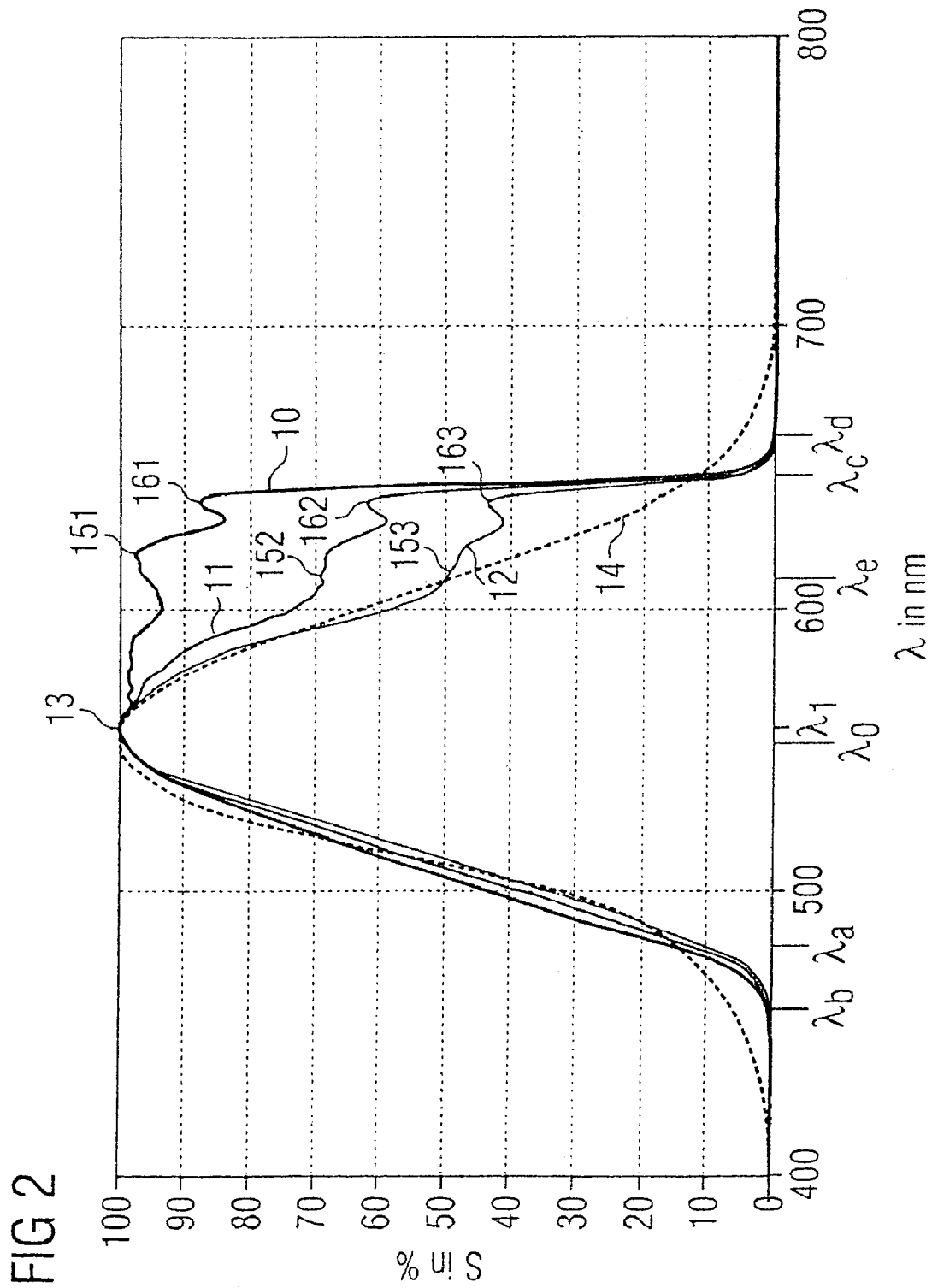

RADIATION DETECTOR WITH CONTROLLED SPECTRAL SENSITIVITY DISTRIBUTION

CROSS-REFERENCE TO RELATED APPLICATIONS

This application is the National Stage of International Application No. PCT/DE2004/001877, filed Aug. 24, 2004, which claims the priority to German Patent Application Serial No. 103 45410.1, filed on Sep. 30, 2003. The contents of both applications are hereby incorporated by reference in their entireties.

FIELD OF THE INVENTION

The invention concerns a radiation detector according to the spectral sensitivity distribution of the human eye.

BACKGROUND OF THE INVENTION

Radiation detectors equipped with a specially adapted filter arrangement, such as for example interference filters or monochromators, are often used to detect radiation with a defined spectral sensitivity distribution that has a maximum at a defined wavelength $\lambda_0$. Such detectors are characterized by a very good match with the defined spectral sensitivity distribution, but are usually comparatively labor- and cost-intensive to operate and produce. In addition, they frequently have high spatial requirements, making them of limited or no use in small-space applications.

If the defined spectral sensitivity distribution is that of the human eye, then a silicon photodiode is often used to detect incident radiation with this sensitivity.

The sensitivity of a photodiode depends, among other things, on the wavelengths of the incident radiation. For wavelengths above a cutoff wavelength the sensitivity is at least nearly zero, since for incident radiation in this wavelength range the energy gap of the functional material of the diode—Si, for example—is greater than the energy of the incident radiation, and the latter is therefore insufficient to generate electron/hole pairs. On the other hand, the sensitivity decreases in the range of diminishing wavelengths, since as the wavelength declines the electron/hole pairs that are generated, for example by surface recombination, progressively stop contributing to the photocurrent. In the intermediate range, the sensitivity of the diode presents a maximum which in the case of a silicon photodiode is located at about 800 nm.

To use such a silicon photodiode as a detector with the spectral sensitivity distribution of the bright-adapted human eye, which has a sensitivity maximum at about 555 nm, requires extra expenditure, since the wavelengths of the sensitivity maxima differ greatly from each other and the two spectral sensitivity distributions are therefore relatively poorly matched. The matching of detector sensitivity to the sensitivity distribution of the human eye can be improved through the use of multiple complex filters. The sum of these filters yields the sensitivity of the human eye.

SUMMARY OF THE INVENTION

The object of the invention, therefore, is to specify a radiation detector of the kind cited at the beginning hereof that can be produced as simply and inexpensively as possible and offers a good match with the defined spectral sensitivity distribution, particularly that of the human eye.

For a good match to be present, it is to be considered sufficient in the context of the invention that the sensitivity of the detector largely correspond to the defined sensitivity. It is not absolutely necessary for these sensitivities to agree completely. The aim instead should be to achieve the best possible match to the defined sensitivity with the lowest possible expenditure.

A radiation detector for detecting radiation according to a defined spectral sensitivity distribution having a sensitivity maximum at a defined wavelength $\lambda_0$ comprises according to the instant invention at least one semiconductor chip containing a III-V semiconductor material.

According to the invention, the semiconductor chip is preferably an LED chip intended for use as a radiation emitter in a conventional LED. This permits low-cost implementation of the radiation detector, since an LED chip intended to function as a radiation emitter can be used as the semiconductor chip in the radiation detector, thereby avoiding the expenditure of custom-fabricating a semiconductor chip mated to the radiation detector.

The III-V semiconductor material preferably contains the functional material of the semiconductor chip, particularly of the LED chip, and/or is so selected that the sensitivity of the semiconductor chip within the range of the defined spectral sensitivity distribution is different from zero. The sensitivity of the chip is determined by the intensity of the photocurrent produced by a radiation incident on the semiconductor chip through the generation of electron/hole pairs in the functional material. The intensity of the photocurrent depends on the incident radiant power and the wavelength of the incident radiation, and is typically on the order of a nA. The photocurrent therefore preferably passes through an operational amplifier for purposes of better signal processing or detection.

Particularly preferably, the semiconductor chip, particularly the LED chip, has a sensitivity maximum at a wavelength $\lambda_1$ that differs as little as possible from the defined wavelength $\lambda_0$. Wavelength $\lambda_0$ is advantageously in the region of the emission wavelength—for example the peak or dominant wavelength—of the LED chip that the chip would emit if operated as a radiation emitter.

It should be noted, however, that wavelength $\lambda_1$ need not necessarily correspond to a sensitivity maximum of the semiconductor chip, particularly of the LED chip. It can instead suffice for the sensitivity to assume a sufficiently high value at $\lambda_1$, if for example no suitable semiconductor is available that has a sensitivity maximum at $\lambda_1$ which in the above sense is close enough to $\lambda_0$.

The quantitative difference between the wavelengths $\lambda_0$ and $\lambda_1$ is preferably less than 50 nm, particularly preferably less than 15 nm. The radiation detector can thus be prematched to the defined sensitivity by suitably selecting the LED chip or the III-V semiconductor material.

The defined spectral sensitivity distribution is often stated such that it assumes the value 1 or 100% at the wavelength $\lambda_0$. The sensitivity of the semiconductor chip, particularly the LED chip, which depends on the photocurrent, is often stated in amperes per watt of the incident radiant power.

To compare the detector sensitivity with the defined spectral sensitivity distribution, it is therefore advantageous to match the two sensitivities to each other such that the defined sensitivity assumes the value 100% at $\lambda_0$ and the sensitivity of the detector does so at $\lambda_1$ (relative sensitivities). The present description pertains to relative sensitivities unless otherwise stated.

It is provided according to the invention that to prematch the detector sensitivity to the defined spectral sensitivity distribution, it is possible to use LED chips of the kind employed in
commercial LEDs having a III-V semiconductor material as functional material. This advantageously eliminates the effort and associated costs involved in specially fabricating a new semiconductor chip for a detector.

Depending on wavelength $\lambda_0$, for example semiconductor chips, particularly LED chips, can be used that contain $In_xGa_yAl_{1-x-y}P$, $In_xGa_yAl_{1-x-y}N$ or $In_xGa_yAl_{1-x-y}As$, with in each case $0 \leq x \leq 1$, $0 \leq y \leq 1$ and $x+y \leq 1$, as the III-V semiconductor material. III-V semiconductor materials are distinguished by an advantageously high internal quantum efficiency that is easier to achieve. This is true in particular in the visible region of the spectrum, where wavelength $\lambda_0$ is advantageously located. Semiconductor materials comprised of the material systems $In_xGa_yAl_{1-x-y}P$ or $In_xGa_yAl_{1-x-y}N$ are particularly well suited for this region of the spectrum.

In a preferred configuration of the invention, disposed after the semiconductor chip, particularly the LED chip, is at least one optical filter that improves the matching of detector sensitivity to the defined sensitivity distribution. This is effected for example by the absorption of wavelengths from the incident radiation for which the sensitivity of the semiconductor chip, particularly of the LED chip, is higher than that of the defined spectral sensitivity distribution.

Such a filter preferably absorbs wavelengths that are greater than $\lambda_0$, and can be disposed at least partially inside, outside and/or on an encapsulation that at least partially surrounds the semiconductor chip, particularly the LED chip. Furthermore, the encapsulant can itself constitute the optical filter or a portion thereof.

The optical filter preferably contains a plurality of filter particles, which particularly preferably are disposed in the encapsulation and contain for example organic dyes.

The optical filter can also be provided, for example in the form of a filter film or filter material, on the encapsulation and/or on a filter structure outside the encapsulation.

Examples of encapsulants are reaction resins, preferably acrylic, epoxy or silicon resins or a mixture of these materials.

Such materials are often used in the semiconductor industry to encapsulate semiconductor chips, particularly LED chips. In LEDs configured as conventional radiation emitters, the encapsulant of the LED chip is largely transparent to the emitted radiation. In the context of the invention, however, a radiation detector can comprise a filter arrangement of the aforesaid kind that absorbs precisely those wavelengths that would be generated by the LED chip when functioning as a radiation emitter.

In an advantageous configuration of the invention, the semiconductor chip, particularly the LED chip, contains at least one filter layer. This filter layer is preferably disposed on the surface, particularly a surface on the radiation entry side, of the chip. The filter layer advantageously absorbs wavelengths that are smaller than the wavelength $\lambda_0$ of the defined spectral sensitivity distribution, thus further improving the matching of detector sensitivity to the defined spectral sensitivity distribution, particularly at the short-wave end.

The filter layer is preferably fashioned in the form of a passivating, cover and/or protective layer, for example of the kind already contained or integrated in commercial LED chips. Such a filter layer is so fashioned that incident radiation of a wavelength smaller than $\lambda_0$ is absorbed in a manner that further improves the matching of the detector sensitivity to the defined spectral sensitivity distribution. Such layers usually have an energy gap that is greater than the energy gap of the active region of the LED chip. These layers are largely transparent to the radiation generated by the LED and protect the functional material for example against deleterious external influences.

The filter layer can optionally be integrated monolithically in the semiconductor chip, particularly in the LED chip, by fabricating the filter layer, for example epitaxially on a growth substrate, together with a semiconductor body for the semiconductor chip.

The detector sensitivity in this case is preferably affected by the filter layer in such a way that at an arbitrary wavelength that is smaller than $\lambda_0$, the difference between the detector sensitivity and the defined sensitivity is less than 25%, particularly preferably less than 15%.

With particular advantage, the detector sensitivity for wavelengths smaller than $\lambda_0$ need not be additionally matched to the defined sensitivity by means of optical filters disposed outside the semiconductor chip, particularly the LED chip. The matching can instead achieved by means of the filter layer contained in the semiconductor chip, particularly the LED chip.

Filtering for wavelengths smaller than $\lambda_0$ can also be achieved by means of an optical filter of the aforesaid kind that is disposed outside the semiconductor chip, particularly the LED chip, for example in the encapsulation. However, if a filter layer of the aforesaid kind is already provided in the semiconductor chip, particularly in the LED chip, the production expenditure and production cost of the radiation detector will advantageously be reduced.

In a further advantageous improvement of the invention, at an arbitrary wavelength the difference between the detector sensitivity and the defined sensitivity is less than 40%, preferably less than 25%. Particularly advantageous for this purpose is to combine a filter layer on or integrated in the LED chip with a downstream optical filter of the aforesaid kind. Such detectors offer low spatial requirements compared to other detectors and a good match with the defined spectral sensitivity distribution.

Particularly preferably, at a wavelength, particularly an arbitrary wavelength, in a region of the spectrum containing the maximum $\lambda_0$ of the defined sensitivity, the difference between the detector sensitivity and the defined sensitivity is less than 15%.

The following procedure can be used to match the sensitivities. First, the LED chip is so selected that its sensitivity is well prematched to the defined sensitivity.

This prematching can take place either with respect to the flanks—the wavelength ranges greater or smaller than $\lambda_0$—of the defined spectral sensitivity distribution or with respect to its maximum, for example through the choice of a suitable LED chip.

Further matching is achieved by means of the filters—optical filters or filter layers downstream of the LED chip,—which absorb particularly in the wavelength range in which the LED chip has a higher sensitivity than the defined sensitivity distribution.

Since LED chips frequently have their highest sensitivity in the region of their emission wavelength, it should be noted that such filters would reduce radiation output if used as radiation emitters in a conventional LED. This is particularly true of optical filters disposed in the encapsulation of the LED chip. Hence, such an encapsulation is not comparable to the encapsulation of a conventional LED chip serving as a radiation emitter.

The difference between the values of the detector sensitivity and the defined sensitivity at a defined wavelength in the case of sensitivity values greater than 50% is preferably less than 25%, particularly preferably less than 15%.

In a particularly preferred configuration of the invention, the defined spectral sensitivity distribution is that of the human eye, with a maximum at wavelength $\lambda_0$. This wavelength is usually located at about 555 nm for a bright-adapted eye (day vision) and about 500 nm for a dark-adapted eye (night vision).

LED chips having an emission wavelength in the visible, particularly in the red, region of the spectrum are particularly well suited for this defined sensitivity, since despite their red emission wavelength they can have a high sensitivity at the aforesaid wavelengths. One advantageous semiconductor material for the sensitivity distribution of the bright-adapted eye is $In_xGa_yAl_{1-x-y}P$, since an LED chip based on this material, depending on its exact composition, can have a sensitivity maximum in the region of the above-cited wavelength. The sensitivity of the detector can be further matched to the sensitivity of the eye through the use of optical filters and filter layers of the aforesaid kind.

The radiation detector can further be configured as a surface-mountable component.

Inventive radiation detectors are preferably used to control and/or influence devices whose manner of operation, period of operation, perception and/or use is related to the defined spectral sensitivity distribution.

Examples of the foregoing are controlling the brightness levels of lighting devices and indicators and the turn-on and turn-off instants of lighting devices. Such lighting devices can be implemented as indoor and outdoor area lights for residences, streets or cars, as well as backlighting devices for displays such as cell phone displays, auto displays or LCD screens. It is of particular interest for the radiation detector to have smaller spatial requirements in the latter applications.

In the cited uses of the invention, the defined sensitivity is preferably that of the human eye. In this way, for example the brightness levels of the aforesaid lighting devices can advantageously be controlled—by increasing or decreasing the brightness—in accordance with their perception by the human eye.

Another area of application is the use of such a radiation detector as an environmental light sensor. Here again, the defined sensitivity is preferably that of the human eye.

BRIEF DESCRIPTION OF THE DRAWINGS

Further features, advantages and suitabilities of the invention will emerge from the descriptions of the following exemplary embodiments in combination with the following figures.

FIGS. 1a and 1b are, respectively, a schematic sectional view of a first exemplary embodiment of an inventive radiation detector and a schematic sectional view of a portion of a second exemplary embodiment of an inventive radiation detector;

FIG. 2 schematically depicts the spectral distribution of the detector sensitivities of a third exemplary embodiment of an inventive radiation detector equipped with different optical filters and the defined spectral sensitivity distribution of the bright-adapted human eye, which with respect to sensitivity values is referred to the sensitivity of the chip.

Like and like-acting elements have the same reference numerals in the figures.

DETAILED DESCRIPTION OF THE PREFERRED EMBODIMENTS

FIG. 1a represents a schematic sectional view of an LED chip 1 of the kind that can be used in an inventive radiation detector. The chip 1 comprises a layer of a functional material 2, which for example contains the III-V semiconductor material InGaAlP and is bounded by confinement layers. Such semiconductor material is characterized by a high quantum efficiency and is commonly used in light-emitting diodes, such as for example the diode having the type designation F 1998 A (manufactured by Osram Opto Semiconductors GmbH). This LED has an emission wavelength in the red region of the spectrum of about 630 nm.

Disposed after the functional layer 2 is a filter layer 3, which absorbs incident radiation of wavelengths smaller than the wavelength corresponding to the energy gap of functional layer 2. This filter layer is already provided in the type of LED chip used in F 1998 A, and in that LED, when the latter is functioning as a radiation emitter, serves for example as a protective and/or cover layer that can ward off harmful external influences on the LED chip.

FIG. 1b shows a schematic sectional view of a portion of an exemplary embodiment of an inventive radiation detector. The LED chip 1 from FIG. 1a is disposed in an encapsulation 4 containing a reaction resin. This reaction resin is preferably provided with organic dye particles 5 that can absorb the spectral subregions of the incident radiation and thus act as optical filters. The LED chip is further provided with a bond pad 6 and an electrode 7 for electrically contacting the LED chip. Via the external electrical terminal 8 connected to electrode 7 and an additional external terminal (not shown in FIG. 1b) connected to bond wire 9, a photocurrent generated in the functional layer by an incident radiation can be measured, where applicable by means of an operational amplifier. The dependence of the photocurrent on the incident radiant power and the wavelength of the radiation determines the sensitivity of a radiation detector comprising such a structure featuring LED chip 1, provided with filter layer 3, and encapsulation 4 in which the dye particles 5 are disposed.

Such a radiation detector is inexpensive to manufacture, since the LED chips used are the kind employed in conventional LEDs configured as radiation emitters. Differences between these detectors and LEDs lie in the nature of the encapsulant. Whereas in LEDs the encapsulant is transparent to the generated radiation, in the case of the radiation detector it may be desirable for the encapsulant 4 with the filter particles 5 to absorb precisely those wavelengths that are in the range in which the LED chip would emit, in order advantageously to improve the matching of the detector sensitivity to the defined sensitivity.

FIG. 2 makes it clear how the detector sensitivity is matched to the spectral sensitivity distribution of the human eye by optical filtering, for example in the encapsulation of the LED chip.

Illustrated schematically in FIG. 2 are the spectral distributions of the relative detector sensitivities 10, 11 and 12 of inventive radiation detectors equipped with different optical filters and the defined spectral sensitivity distribution 14 of the bright-adapted human eye, as a function of the wavelength $\lambda$ of the incident radiation. The sensitivity S is stated in percent.

Each radiation detector contains an LED chip of the kind used for example in the LED F 1998 A (manufactured by Osram Opto Semiconductors GmbH). The LED chip has an emission wavelength in the red region of the spectrum of about 630 nm and contains InGaAlP as its functional material. The illustrated relative sensitivity distributions 10, 11 and 12 of the detectors are stated for incident light coming from the side occupied by the filter layer 3, which, as illustrated in FIG. 1a or 1b, is disposed after the functional layer 2 of the LED chip 1. All the curves 10, 11 and 12 of detector sensitivity have a sensitivity maximum 13 at $\lambda_1$=560 nm. The detectors corresponding to these curves differ with respect to their optical filter arrangements disposed after the LED chip 1. The detector corresponding to sensitivity distribution 10 is fashioned without a filter arrangement after the LED chip 1, whereas in distributions 11 and 12 a filtering encapsulation 1 mm or 2 mm thick, respectively, is provided around the LED chip. The filtering encapsulation is for example, as in FIG. 1b, a reaction resin containing for example green organic dyes.

The relative spectral sensitivity distribution of a bright-adapted human eye is maximal at $\lambda_0$=555 nm and is represented in FIG. 2 by a dotted curve 14. In case of doubt, the eye sensitivity distribution given in the relevant DIN standard can be used in the context of the invention.

Further illustrated in FIG. 2 are wavelengths $\lambda_a$, $\lambda_b$, $\lambda_c$, $\lambda_d$ and $\lambda_e$ denoting the different ranges of the sensitivity distributions shown.

In the wavelength range between about $\lambda_a$ and $\lambda_1$, sensitivities 10, 11 and 12 already agree well with eye sensitivity 14 owing to the presence of filter layer 3, which can absorb the incident radiation in this wavelength range and thereby affects the match of detector sensitivity 10, 11, 12 to eye sensitivity 14.

The detector sensitivity and the eye sensitivity, which share the same sensitivity value in this wavelength range, preferably differ from each other in terms of wavelength by less than 30 nm, particularly preferably less than 15 nm.

In addition, the difference between the sensitivity values of the eye and detector sensitivities at a defined wavelength in this range is less than 15%.

When $\lambda < \lambda_{a-}$, detector sensitivities 10, 11, 12 decline much more sharply than eye sensitivity 14 and are already at least nearly zero for wavelengths below about $\lambda_b$. One cause of this may be the surface recombination of electron/hole pairs, since these pairs are no longer able to contribute to the photocurrent. At wavelengths greater than about $\lambda_c$ the detector sensitivities also decline more sharply than the eye sensitivity, since at wavelengths greater than $\lambda_c$ the energy of the incident radiation is no longer sufficient for generating electron/hole pairs.

Curve 10 shows, in addition to sensitivity maximum 13, still further local maxima 151 and 161. These are in the range around the emission wavelength of the LED chip, which is about 630 nm. As can be seen from curve 10, the detector sensitivity for $\lambda > \lambda_0$ still deviates relatively sharply throughout its path from the eye sensitivity, the maximum difference in the sensitivity values being about 70%.

For many applications of such a radiation detector, particularly for applications aimed at wavelengths below $\lambda_0$, this match with the sensitivity of the eye can be sufficient in and of itself. This is to advantage in particular when the detector is intended for small-space applications and a relatively thick filtering encapsulation disadvantageously increases the size of the component.

As stated above, such matching can be achieved merely by a suitable choice of semiconductor material or LED chip.

To improve the matching of detector sensitivity to the sensitivity of the eye, in the detectors corresponding to curves 11 and 12 an encapsulation is provided that absorbs from the incident radiation wavelengths greater than 555 nm, particularly in the red spectral region of local maximum 151 at about 630 nm.

The thickness of the encapsulation determines the radiant power of the incident radiation absorbed therein, and thus the photocurrent generated and the detector sensitivity.

A further improvement in matching to the sensitivity 14 of the eye over that of detector sensitivity 10 is achieved with a 1 mm thick green encapsulation, as can be seen from the illustrated detector sensitivity 11. The local maximum 151 of curve 10 corresponds to shoulder 152 in curve 11 and is greatly flattened by absorption in the encapsulation. Local maximum 161 is still present in the form of maximum 162, which due to absorption in the encapsulation has a lower sensitivity value than local maximum 161.

If a 2-mm-thick green encapsulation is provided, the matching of the corresponding detector sensitivity 12 to eye sensitivity 14 is improved still further by the higher absorbed radiant power. Here again, local maximum 162 is preserved in the form of maximum 163. The original maximum 151 is so flattened at 153 as to be no longer recognizable.

In this case, the difference between the sensitivity values of the detector and the eye at a defined wavelength is less than 25%.

With sensitivity S values in excess of about 50%, the detector is very well matched to the sensitivity of the eye and the difference between the detector and eye sensitivity values is less than about 10%. Such matching to the sensitivity of the eye can be adequate for applications, since this is precisely the range in which the eye is most sensitive.

Between about $\lambda_e$ and $\lambda_c$, detector sensitivity 12 again deviates relatively sharply from eye sensitivity 14. If an additional filter arrangement were provided in the radiation detector that absorbed in the range corresponding to local maximum 163, 162 or 161, the match to eye sensitivity 13 [numeral sic] could be improved still further in this range.

The invention is not limited to the sensitivity of the eye, but should be considered applicable to all defined spectral sensitivities having a maximum at a wavelength $\lambda_0$ and to which the sensitivity of a radiation detector containing an LED chip can be matched. Should the sensitivity of the LED chip be less than the defined sensitivity in some wavelength ranges, then optical amplification systems can in particular be provided that advantageously bring about matching of the detector sensitivity to the defined sensitivity.

The invention is not limited by the description with reference to the exemplary embodiments. Rather, the invention encompasses any novel feature and any combination of features, including in particular any combination of features contained in the claims, even if that feature or combination itself is not explicitly mentioned in the claims or exemplary embodiments.

The invention claimed is:

1. A radiation detector for detecting incident radiation according to a predetermined spectral sensitivity distribution having a sensitivity maximum at a predetermined wavelength $\lambda_0$, said radiation detector comprising at least one semiconductor chip and at least one optical filter, wherein
the at least one semiconductor chip comprises at least one III-V semiconductor material;
the at least one optical filter is disposed outside the at least one semiconductor chip, and the at least one optical filter is configured to receive the incident radiation, to absorb a portion of the incident radiation having a wavelength that is greater than the wavelength $\lambda_0$ of the sensitivity maximum, and to transmit filtered radiation to the at least one semiconductor chip; and the radiation detector has a detector sensitivity such that at an arbitrary wavelength, a difference between corresponding values of the detector sensitivity and the predetermined spectral sensitivity distribution is less than 40%.

2. The radiation detector of claim 1, wherein the predetermined spectral sensitivity distribution is a standard sensitivity distribution of a human eye.

3. The radiation detector of claim 1, wherein the at least one semiconductor chip comprises a layer structure that corresponds to a layer structure of a light emitting diode.

4. The radiation detector of claim 1, wherein a sensitivity distribution of the at least one semiconductor chip exhibits at least one maximum at a wavelength $\lambda_1$, and wherein a difference between $\lambda_1$ and $\lambda_0$ is 50 nm or less.

5. The radiation detector of claim 4, wherein the difference between $\lambda_1$ and $\lambda_0$ is 15 nm or less.

6. The radiation detector of claim 1, wherein the at least one semiconductor chip comprises a filter layer.

7. The radiation detector of claim 6, wherein the filter layer absorbs radiation having a wavelength that is smaller than $\lambda_0$.

8. The radiation detector of claim 1, wherein the at least one III-V semiconductor material is $In_xGa_yAl_{1-x-y}P$, $In_xGa_yAl_{1-x-y}N$, or $In_xGa_yAl_{1-x-y}As$, and wherein $0 \leq x \leq 1$, $0 \leq y \leq 1$ and $x+y \leq 1$ for the at least one semiconductor material.

9. A radiation detector comprising at least one semiconductor chip and operative to detect incident radiation according to a standard spectral sensitivity distribution of a human eye,
wherein the at least one semiconductor chip comprises at least one III-V semiconductor material; and
wherein the radiation detector has a detector sensitivity such that at an arbitrary wavelength, a difference between corresponding values of the detector sensitivity and the standard spectral sensitivity distribution of a human eye is less than 40%.

10. The radiation detector of claim 9, further comprising at least one optical filter that is disposed outside the at least one semiconductor chip, wherein the at least one optical filter is configured to receive the incident radiation, to absorb a portion of the incident radiation having a wavelength that is greater than a wavelength $\lambda_0'$ of a sensitivity maximum of the human eye, and to transmit filtered radiation to the at least one semiconductor chip.

11. The radiation detector of claim 10, wherein the at least one optical filter comprises a plurality of filter particles.

12. The radiation detector of claim 9, wherein the at least one semiconductor chip comprises a layer structure that corresponds to a layer structure of a light emitting diode.

13. The radiation detector of claim 12, wherein the at least one semiconductor chip comprises a layer structure configured so that if the at least one semiconductor chip is operated to emit light, a central emission wavelength of the emitted light is in an infrared region of the spectrum.

14. The radiation detector of claim 9, wherein a sensitivity distribution of the at least one semiconductor chip exhibits at least one maximum at a wavelength $\lambda_1$, and wherein a difference between $\lambda_1$ and $\lambda_0'$ is 50 nm or less.

15. The radiation detector of claim 14, wherein the difference between $\lambda_1$ and $\lambda_0'$ is 15 nm or less.

16. The radiation detector of claim 9, wherein the detector comprises an encapsulation that at least partially surrounds said at least one semiconductor chip.

17. The radiation detector of claim 16, wherein the encapsulation comprises a resin, preferably a reaction resin.

18. The radiation detector of claim 16, further comprising at least one optical filter that is disposed outside the at least one semiconductor chip,
wherein the at least one optical filter is configured to receive the incident radiation, to absorb a portion of the incident radiation having a wavelength that is greater than a wavelength $\lambda_0'$ of a sensitivity maximum of the human eye, and to transmit filtered radiation to the at least one semiconductor chip, and
wherein the at least one optical filter is disposed at least partially inside, outside and/or on the encapsulation and/or the encapsulation forms the at least one optical filter.

19. The radiation detector of claim 9, wherein the at least one semiconductor chip comprises a filter layer.

20. The radiation detector of claim 19, wherein the filter layer absorbs radiation having a wavelength that is smaller than $\lambda_0'$.

21. The radiation detector of claim 19, wherein the filter layer extends over an entire face of the at least one semiconductor chip.

22. The radiation detector of claim 9, wherein the at least one III-V semiconductor material is $In_xGa_yAl_{1-x-y}P$, and wherein $0 \leq x \leq 1$, $0 \leq y \leq 1$ and $x+y \leq 1$.

23. The radiation detector of claim 9, wherein the difference between corresponding values of the detector sensitivity and the standard spectral sensitivity distribution of the human eye is less than 25%.

24. The radiation detector of claim 9, wherein the radiation detector is configured for use as an environmental light sensor.

25. A radiation detector for detecting incident radiation according to a predetermined spectral sensitivity distribution having a sensitivity maximum at a predetermined wavelength $\lambda_0$, the detector comprising:
at least one semiconductor chip comprising a filter layer and at least one III-V semiconductor material; and
at least one optical filter disposed outside the at least one semiconductor chip,
wherein the at least one optical filter is configured to receive the incident radiation, to absorb a portion of the incident radiation having a wavelength that is greater than the wavelength $\lambda_0$ of the sensitivity maximum, and to transmit filtered radiation to the at least one semiconductor chip; and
wherein the radiation detector has a detector sensitivity such that at an arbitrary wavelength, a difference between corresponding values of the detector sensitivity and the predetermined spectral sensitivity distribution is less than 40%.

* * * * *